United States Patent
Wang

(10) Patent No.: US 8,783,836 B2
(45) Date of Patent: Jul. 22, 2014

(54) PIEZOELECTRIC ELEMENT, LIQUID EJECTING HEAD, AND LIQUID EJECTING APPARATUS

(75) Inventor: Xiaoxing Wang, Chino (JP)

(73) Assignee: Seiko Epson Corporation, Tokyo (JP)

( * ) Notice: Subject to any disclaimer, the term of this patent is extended or adjusted under 35 U.S.C. 154(b) by 59 days.

(21) Appl. No.: 13/315,259

(22) Filed: Dec. 8, 2011

(65) Prior Publication Data

US 2012/0147099 A1    Jun. 14, 2012

(30) Foreign Application Priority Data

Dec. 9, 2010   (JP) ................... 2010-274320

(51) Int. Cl.
*B41J 2/045*   (2006.01)
*H01L 41/00*   (2013.01)
*H02N 2/00*   (2006.01)

(52) U.S. Cl.
USPC ........................................... 347/68; 310/311

(58) Field of Classification Search
None
See application file for complete search history.

(56) References Cited

U.S. PATENT DOCUMENTS

2011/0216131 A1* 9/2011 Hamada ..................... 347/68

FOREIGN PATENT DOCUMENTS

| JP | 2001-223404 | | 8/2001 |
| JP | 2009-010367 | | 1/2009 |
| JP | 2010030810 A | * | 2/2010 |

* cited by examiner

*Primary Examiner* — Matthew Luu
*Assistant Examiner* — Erica Lin
(74) *Attorney, Agent, or Firm* — Workman Nydegger

(57) ABSTRACT

A piezoelectric element includes a piezoelectric layer, and an electrode provided to the piezoelectric layer. The piezoelectric layer is configured of a complex oxide having a perovskite structure containing potassium, sodium, and bismuth, niobium, iron, and chromium.

7 Claims, 14 Drawing Sheets

EXAMPLE 2 (5 mol% BiCrO$_3$)

EXAMPLE 3 (8 mol% BiCrO$_3$)

EXAMPLE 4 (12 mol% BiCrO₃)

COMPARATIVE EXAMPLE 1 (NOT CONTAINING BiCrO₃)

EXAMPLE 1 (3 mol% BiCrO$_3$)

1.00 μm

EXAMPLE 2 (5 mol% BiCrO$_3$)

1.00 μm

EXAMPLE 3 (8 mol% BiCrO$_3$)

EXAMPLE 4 (12 mol% BiCrO$_3$)

COMPARATIVE EXAMPLE 1 (NOT CONTAINING BiCrO₃)

EXAMPLE 1

COMPARATIVE EXAMPLE 1

PIEZOELECTRIC ELEMENT, LIQUID EJECTING HEAD, AND LIQUID EJECTING APPARATUS

CROSS-REFERENCE TO RELATED APPLICATIONS

The entire disclosure of Japanese Patent Application No. 2010-274320, filed Dec. 9, 2010 is expressly incorporated by reference.

BACKGROUND

1. Technical Field

The present invention relates to a liquid ejecting head including a piezoelectric element that causes a change in pressure in a pressure-generating chamber communicating with a nozzle opening and has a piezoelectric layer and electrodes for applying a pressure to the piezoelectric layer, and relates to a liquid ejecting apparatus and a piezoelectric element.

2. Related Art

In some of piezoelectric elements used in liquid ejecting heads, the piezoelectric element has a structure in which a piezoelectric layer made of a piezoelectric material exhibiting an electromechanical conversion function such as a crystallized dielectric material is disposed between two electrodes. Such a piezoelectric element is mounted on a liquid ejecting head as a flexure-vibration-mode actuator. A typical example of the liquid ejecting head is an ink jet recording head in which a diaphragm configures a part of a pressure-generating chamber communicating with a nozzle opening for discharging ink droplets and a pressure is applied to the ink in the pressure-generating chamber by deforming the diaphragm by a piezoelectric element to discharge the ink as droplets from the nozzle opening.

The piezoelectric material used for the piezoelectric element is required to have high piezoelectric properties, and their typical examples include lead zirconate titanate (PZT) (see JP-A-2001-223404).

However, from the viewpoint of an environmental problem, there is a demand for a piezoelectric material having a less content of lead. As an example of the piezoelectric material not containing lead, a potassium sodium niobate-based piezoelectric material has been proposed (see JP-A-2009-10367). The potassium sodium niobate-based material has high piezoelectric properties and a high Curie temperature Tc, which is therefore useful as a lead-free piezoelectric material.

Unfortunately, crack occurs easily to the potassium sodium niobate-based piezoelectric layers during the preparation process. Especially in case of making thick piezoelectric layers, crack problem becomes more serious.

Such a problem occurs not only in ink jet recording heads, but also in other liquid ejecting heads for discharging droplets other than ink. In addition, the problem occurs in piezoelectric elements that are used for devices other than liquid ejecting heads.

SUMMARY

An advantage of some aspects of the invention is to provide a piezoelectric element with low environmental loads and without crack for a liquid ejecting head and a liquid ejecting apparatus.

An aspect of the invention for solving the above-mentioned problems is a liquid ejecting head including a pressure-generating chamber communicating with a nozzle opening and a piezoelectric element having a piezoelectric layer and electrodes provided to the piezoelectric layer, wherein the piezoelectric layer is configured of a complex oxide having a perovskite structure containing potassium, sodium, and bismuth in the A site and niobium, iron, and chromium in the B site.

In this aspect, co crack happens in the piezoelectric layer. In addition, since no lead is contained, environmental loads can be reduced. Furthermore, the piezoelectric layer shows a low leakage current.

As a preferred embodiment of the present invention, the complex oxide composed of potassium sodium niobate, bismuth ferrate and bismuth chromate is proposed.

It is preferable that the complex oxide has a molar ratio of chromium to niobium (chromium/niobium) of 0.03 or more. According to this, occurrence of cracking in the piezoelectric layer can be suppressed more effectively.

As another preferred embodiment of the invention, the complex oxide has a molar ratio of chromium to niobium (chromium/niobium) of 0.05 or more and 0.08 or less. According to this, occurrence of cracking in the piezoelectric layer can be suppressed more effectively, and high electric properties of the piezoelectric element can be maintained.

A preferred aspect of the invention is that piezoelectric layer has a thickness of 1 μm or more. According to the invention, even if the thickness of the piezoelectric layer is 1 μm or more, cracking can be prevented.

Another aspect of the invention is that a liquid ejecting apparatus is characterized with the above-described liquid ejecting head.

In this aspect, the piezoelectric layer free of crack for a liquid ejecting apparatus can be obtained. In addition, since lead is not contained, environmental loads can be reduced.

Another aspect of the invention is a piezoelectric element including a piezoelectric layer and electrodes provided to the piezoelectric layer, wherein the piezoelectric layer is configured of a complex oxide with a perovskite structure containing potassium, sodium, and bismuth in the A site and niobium, iron, and chromium in the B site.

In this aspect, a crack free piezoelectric layer for a piezoelectric element, can be realized. In addition, since lead is not contained, environmental loads can be reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment 1

Figure 1:
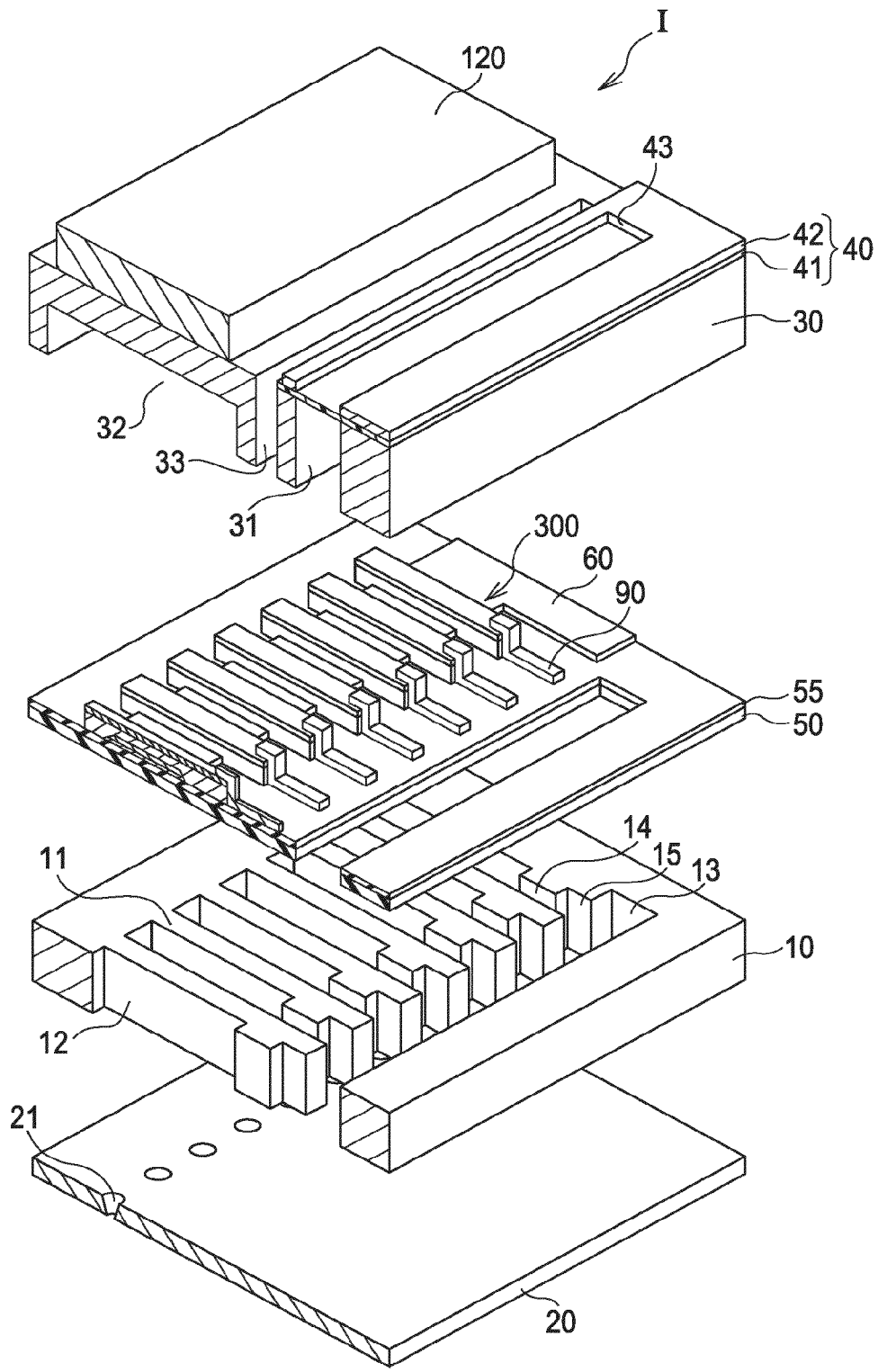
FIG. 1 is an exploded perspective view of schematically illustrating the constitution of a recording head according to Embodiment 1.
Figure 2A:
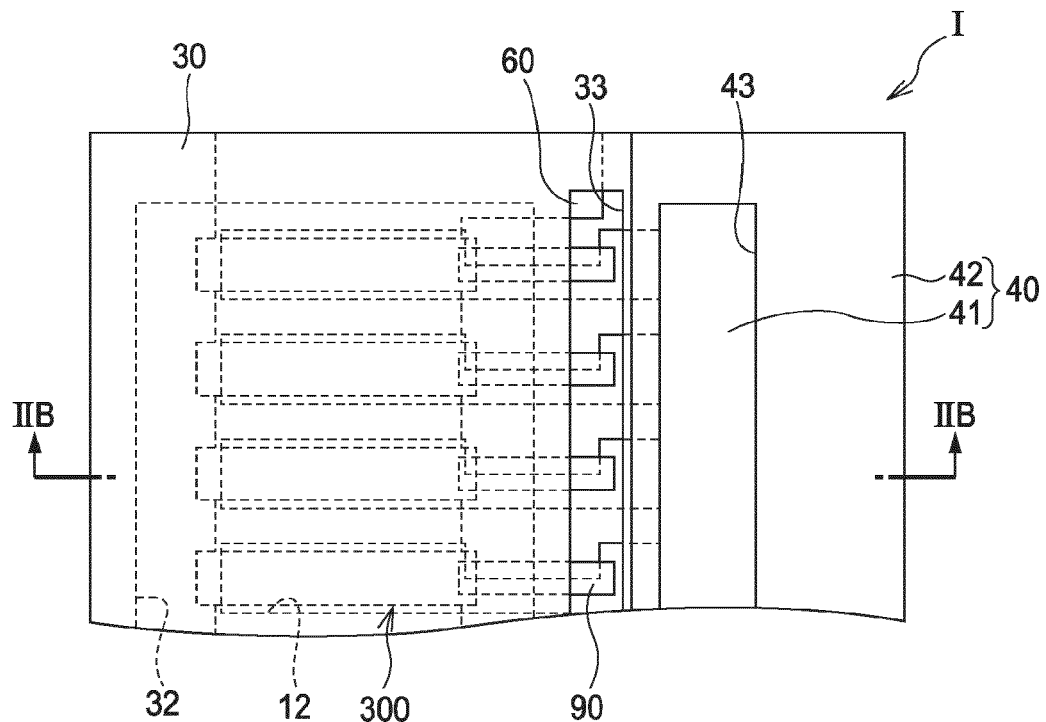
FIG. 2A is a plan view of the recording head according to Embodiment 1.
Figure 2B:
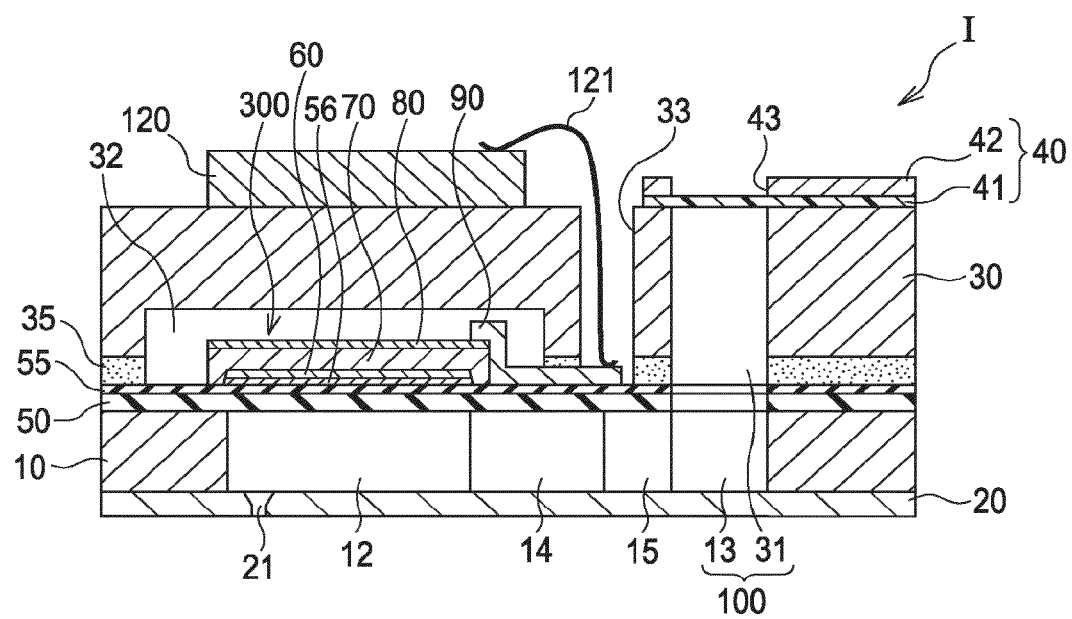
FIG. 2B is a cross-sectional view of the recording head according to Embodiment 1.

FIG. 1 is an exploded perspective view of schematically illustrating the constitution of an ink jet recording head which is an example of the liquid ejecting head according to Embodiment 1 of the invention. FIG. 2A is a plan view of the recording head shown in FIG. 1, and FIG. 2B is a cross-sectional view taken along the line IIB-IIB of FIG. 2A.

The passage-forming substrate 10 of this embodiment is a single-crystal silicon substrate, and an elastic film 50 of silicon dioxide is disposed on one surface thereof.

The passage-forming substrate 10 is provided with a plurality of pressure-generating chambers 12 arranged in parallel in their width direction. Furthermore, the passage-forming substrate 10 is provided with a communicating portion 13 in an area on an outer side in the longitudinal direction of the pressure-generating chambers 12, and the communicating portion 13 and each pressure-generating chamber 12 are communicated with each other through an ink-supplying path 14 and a communicating path 15 provided to each of the pressure-generating chambers 12. The communicating portion 13 communicates with a manifold portion 31 of a protective substrate described below to constitute a part of the manifold serving as the ink chamber common to all the pressure-generating chambers 12. The ink-supplying path 14 has a width narrower than that of the pressure-generating chamber 12 and maintains a constant flow resistance of the ink flowing in the pressure-generating chamber 12 from the communicating portion 13. Incidentally, in the embodiment, the ink-supplying path 14 is formed by narrowing the width of the flow path from one side, but it may be formed by narrowing the width of the flow path from both sides. Alternatively, the ink-supplying path may be formed by narrowing the flow path from the thickness direction, instead of narrowing the width of the flow path. Therefore, in this embodiment, the passage-forming substrate 10 is provided with a liquid passage composed of the pressure-generating chamber 12, the communicating portion 13, the ink-supplying path 14, and the communicating path 15.

In addition, the passage-forming substrate 10 is bonded to a nozzle plate 20 with, for example, an adhesive or a thermal adhesive film on the opened surface side. The nozzle plate 20 is perforated with nozzle openings 21 that communicate with the corresponding pressure-generating chambers 12 in the vicinity of the ends of the pressure-generating chambers 12 on the side opposite to the ink-supplying path 14. The nozzle plate 20 is made of, for example, a glass ceramic, a single-crystal silicon substrate, or stainless steel.

Furthermore, as described above, the elastic film 50 is disposed on the other side of the passage-forming substrate 10 than the opened surface side. On the elastic film 50, an insulator film 55 of zirconium oxide is disposed. On the insulator film 55, an adhesive layer 56 made of, for example, titanium oxide is disposed to increase the adhesion between the insulator film 55 and a first electrode 60.

On the adhesive layer 56, the first electrode 60, a piezoelectric layer 70 that is a thin film having a thickness of 10 μm or less, preferably 0.5 to 1.5 μm, and a second electrode 80 are laminated to constitute a piezoelectric element 300. Herein, the piezoelectric element 300 is a portion including the first electrode 60, the piezoelectric layer 70, and the second electrode 80. In general, one of the electrodes of the piezoelectric element 300 is formed as a common electrode, and the other electrode and the piezoelectric layer 70 are formed by patterning for each pressure-generating chamber 12. In this embodiment, the first electrode 60 is formed as the common electrode of the piezoelectric elements 300, and the second electrode 80 is the individual electrode of each piezoelectric element 300, but these may be reversed depending on a driving circuit or wiring. Furthermore, herein, the piezoelectric element 300 and a diaphragm, which is deformed by driving the piezoelectric element 300, are collectively referred to as an actuator. In the above-mentioned example, the elastic film 50, the insulator film 55, the adhesive layer 56, the first electrode 60, and an insulator film provided according to need function as the diaphragm, but the diaphragm is not limited thereto. For example, the elastic film 50 and the adhesive layer 56 may not be provided. Alternatively, the piezoelectric element 300 itself may substantially function as a diaphragm.

In this embodiment, the piezoelectric layer 70 is made of a complex oxide having a perovskite structure containing potassium, sodium, and bismuth in the A site and niobium, iron, and chromium in the B site. This complex oxide forms a perovskite structure, that is, an octahedron with an $ABO_3$-type structure where the A-site is 12-fold coordinated to oxygen atoms and the B-site is 6-fold coordinated to oxygen atoms. Potassium (K), sodium (Na), and bismuth (Bi) atoms are located on the A-site, and niobium (Nb), iron (Fe), and chromium (Cr) are located on the B-site. Such a complex oxide has a composition ratio of a mixed crystal composed of, for example, potassium sodium niobate ((K,Na)NbO$_3$, hereinafter referred to as KNN), bismuth ferrate (BiFeO$_3$, hereinafter referred to as BFO), and bismuth chromate (BiCrO$_3$, hereinafter referred to as BCO). This complex oxide is preferably a single crystal (mixed crystal) of a uniform solid solution of potassium sodium niobate, bismuth ferrate, and bismuth chromate. In other words, this complex oxide is based on a technical concept that bismuth ferrate and bismuth chromate are added to potassium sodium niobate, and potassium sodium niobate, bismuth ferrate, and bismuth chromate are preferably present in a form of single crystal (mixed crystal) without being independently present.

Thus, the complex oxide constituting the piezoelectric layer 70 contains chromium on the B-site, which prevents occurrence of cracking during the production process of the piezoelectric layer 70, resulting in provision of a piezoelectric layer 70 not having cracking. The complex oxide constituting the piezoelectric layer 70 contains iron on the B-site, which increases the insulation quality of the piezoelectric layer 70, resulting in prevention of a leakage current and an improvement in pressure resistance. That is, in this embodiment, the piezoelectric layer 70 does not have cracking, and a leakage current from the piezoelectric element 300 is prevented. Furthermore, in this embodiment, since the piezoelectric layer 70 does not contain lead, the environmental loads can be reduced.

If the complex oxide does not contain iron on the B-site, a leakage current tends to occur in the piezoelectric layer 70. If the complex oxide does not contain chromium on the B-site, cracking tends to occur during the production process of the piezoelectric layer 70, and thereby the piezoelectric layer 70 tends to have cracking.

The piezoelectric layer 70 made of the above-described complex oxide can have a large thickness such as a thickness of 1 μm or more. In a thick piezoelectric layer made of a potassium sodium niobate-based complex oxide, in particular, in a thick piezoelectric layer made of a complex oxide containing potassium, sodium, and bismuth on the A-site and niobium and iron on the B-site, cracking tends to occur during the production process. However, in the piezoelectric layer made of a complex oxide having a constitution described above, even if the thickness is large, occurrence of cracking during the production process can be prevented. Accordingly, the amount of piezoelectric displacement can be increased by forming the piezoelectric layer 70 so as to have a large thickness.

In this complex oxide, the molar ratio of potassium to the total amount of potassium and sodium is preferably 0.3 to 0.5. For example, in a complex oxide having a composition ratio of a mixed crystal composed of potassium sodium niobate, bismuth ferrate, and bismuth chromate, the potassium sodium niobate is represented by $(Ka_x,Na_{1-x})NbO_3$, which preferably satisfies $0.3 \leq x \leq 0.5$. In this embodiment, x=0.5, i.e., $(Ka_{0.5}, Na_{0.5})NbO_3$ is used.

In this complex oxide, the molar ratio of chromium to niobium (chromium/niobium) is preferably 0.03 or more, more preferably 0.05 or more and 0.08 or less. For example, in a complex oxide having a composition ratio of a mixed crystal composed of potassium sodium niobate, bismuth ferrate, and bismuth chromate, the molar ratio of bismuth chromate (BCO) to potassium sodium niobate (KNN) (BCO/KNN) is preferably 0.03 or more, more preferably 0.05 to 0.08. A complex oxide having a molar ratio of chromium to niobium (chromium/niobium) of 0.03 or more can more certainly prevent occurrence of cracking in the piezoelectric layer. In addition, a complex oxide having a molar ratio of chromium to niobium (chromium/niobium) of 0.05 or more and 0.08 or less can more certainly prevent occurrence of cracking in the piezoelectric layer to maintain the high electric properties of the piezoelectric element.

In this complex oxide, the molar ratio of chromium to iron (chromium/iron) is preferably 1 or more and 3 or less, more preferably 2 or more and 3 or less. For example, in a complex oxide having a composition ratio of a mixed crystal composed of potassium sodium niobate, bismuth ferrate, and bismuth chromate, the molar ratio of bismuth chromate (BCO) to bismuth ferrate (BFO) (BCO/BFO) is preferably 1 or more and 3 or less, more preferably 2 or more and 3 or less. A complex oxide having a molar ratio of chromium to iron (chromium/iron) of 1 or more and 3 or less can more certainly prevent a leakage current from the piezoelectric layer 70. A complex oxide having a molar ratio of chromium to iron (chromium/iron) of 2 or more and 3 or less can more certainly prevent a leakage current from the piezoelectric layer 70 and also improve the piezoelectric properties of the piezoelectric layer.

Each second electrode 80, which is the individual electrode of the piezoelectric element 300, is connected to a lead electrode 90 made of, for example, gold (Au) that is drawn out from the vicinity of the end on the ink-supplying path 14 side and extends on the insulator film 55.

Above the passage-forming substrate 10 provided with such piezoelectric elements 300, that is, above the first electrode 60, the insulator film 55, and the lead electrodes 90, a protective substrate 30 having the manifold portion 31 constituting at least a part of a manifold 100 is bonded with an adhesive 35. In this embodiment, the manifold portion 31 is formed along the width direction of the pressure-generating chambers 12 so as to pass through the protective substrate 30 in the thickness direction and communicates with the communicating portion 13 of the passage-forming substrate 10 to constitute the manifold 100 serving as a common ink chamber for the pressure-generating chambers 12. Alternatively, the communicating portion 13 of the passage-forming substrate 10 may be divided so as to correspond to each pressure-generating chamber 12, and only the manifold portion 31 may serve as the manifold. Furthermore, for example, the passage-forming substrate 10 may be provided with only the pressure-generating chambers 12, and members (for example, the elastic film 50, the insulator film 55, and the adhesive layer 56) interposed between the passage-forming substrate 10 and the protective substrate 30 may be provided with the ink-supplying paths 14 communicating with the manifold 100 and the corresponding pressure-generating chambers 12.

The protective substrate 30 is provided with a piezoelectric element holding portion 32, at the area facing the piezoelectric elements 300, having a space that is enough not to hinder the movement of the piezoelectric elements 300. The space of the piezoelectric element holding portion 32 may be sealed or not be sealed as long as it is enough not to hinder the movement of the piezoelectric elements 300.

The protective substrate 30 is preferably made of a material having almost the same coefficient of thermal expansion as that of the passage-forming substrate 10, for example, made of glass or a ceramic material. In this embodiment, the protective substrate 30 is a single-crystal silicon substrate, which is the same material as that of the passage-forming substrate 10.

The protective substrate 30 is provided with a through-hole 33 passing through the protective substrate 30 in the thickness direction. The through-hole 33 is formed so that the vicinity of the end of the lead electrode 90 drawn out from each piezoelectric element 300 is exposed in the through-hole 33.

Furthermore, a driving circuit 120 for driving the piezoelectric elements 300 arranged parallel is fixed on the protective substrate 30. The driving circuit 120 may be, for example, a circuit board or a semiconductor integrated circuit (IC). The driving circuit 120 and the lead electrodes 90 are electrically connected to each other through connecting wire 121 made of conductive wire such as bonding wire.

In addition, a compliance substrate 40 composed of a sealing film 41 and a fixing plate 42 is bonded on the protective substrate 30. Herein, the sealing film 41 is formed of a flexible material having a low rigidity and seals one side of the manifold portion 31. The fixing plate 42 is formed of a relatively hard material. The fixing plate 42 is provided with an opening 43 by completely removing the fixing plate 42 at the area facing the manifold 100 in the thickness direction. Therefore, the one side of the manifold 100 is sealed with only the sealing film 41 having flexibility.

In such an ink jet recoding head I of the embodiment, ink is fed through an ink inlet connected to exterior ink supplying means (not shown) to fill the inside from the manifold 100 to the nozzle openings 21 with ink. Then, a voltage is applied between the first electrode 60 and the second electrode 80 corresponding to each pressure-generating chamber 12 according to a recording signal from the driving circuit 120 to flexurally deform the elastic film 50, the insulator film 55, the adhesive layer 56, the first electrode 60, and the piezoelectric layer 70. Thereby, the pressure in each pressure-generating chamber 12 is increased, and ink droplets are discharged from the nozzle opening 21.

Then, an example of the method of producing the ink jet recoding head of the embodiment will be described with reference to FIGS. 3A, 3B, 4A to 4C, 5A, 5B, 6A to 6C, 7A, and 7B, which are cross-sectional views of a pressure-generating chamber in the longitudinal direction.

Figure 3A:
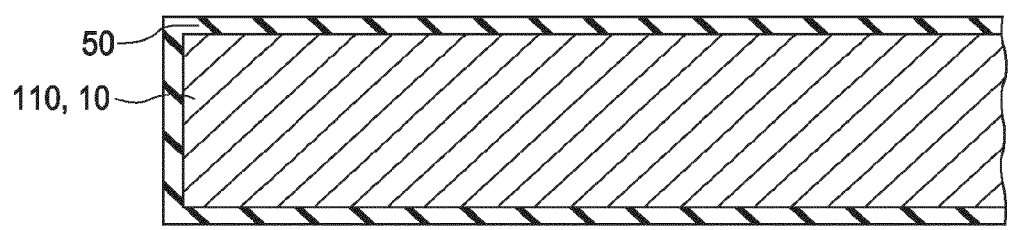
FIG. 3A is a cross-sectional view of a recording head in its production process according to Embodiment 1.
Figure 3B:
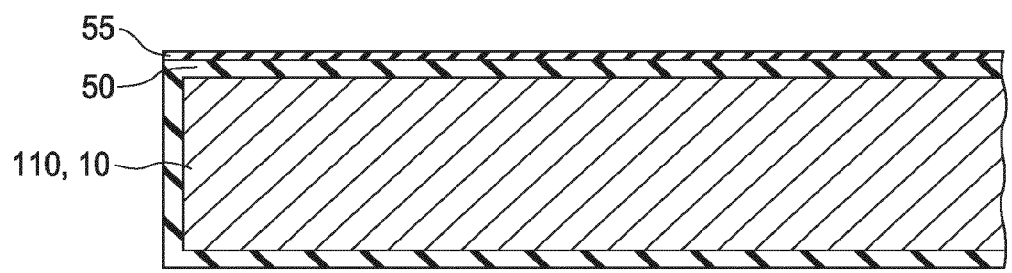
FIG. 3B is a cross-sectional view of the recording head in its production process according to Embodiment 1.

First, as shown in FIG. 3A, a silicon dioxide film of, for example, silicon dioxide ($SiO_2$), constituting the elastic film 50 is formed on the surface of a silicon wafer as the passage-forming substrate wafer 110 by, for example, thermal oxidization. Then, as shown in FIG. 3B, an insulator film 55 of zirconium oxide is formed on the elastic film 50, and an adhesive layer 56 of, for example, titanium oxide is formed on the insulator film 55 by, for example, reactive sputtering or thermal oxidation.

Figure 4A:
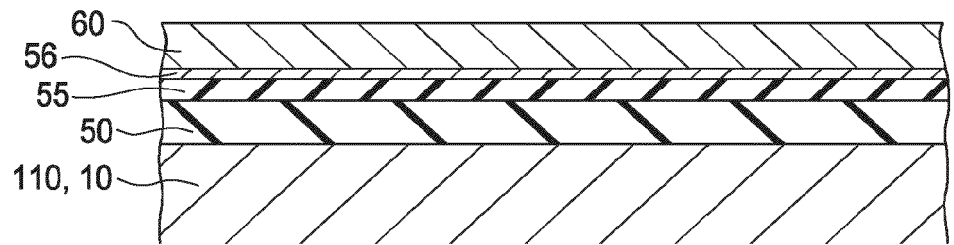
FIG. 4A is a cross-sectional view of the recording head in its production process according to Embodiment 1.

Then, as shown in FIG. 4A, a first electrode 60 made of, for example, platinum, iridium, iridium oxide, or a layered structure thereof is formed on the entire surface of the adhesive layer 56 by, for example, sputtering.

Then, a piezoelectric layer 70 is laminated on the first electrode 60. The method of producing the piezoelectric layer 70 is not particularly limited. For example, the piezoelectric layer 70 can be formed by a metal-organic decomposition (MOD) method, in which a piezoelectric layer 70 of a metal oxide is produced by dissolving/dispersing an organometallic compound in a solvent and applying and drying the solution and firing it at high temperature, or by chemical solution deposition such as a sol-gel method. The piezoelectric layer 70 may be formed by another method, such as a laser ablation method, a sputtering method, a pulse laser deposition method (PLD method), a chemical vapor deposition (CVD) method, or an aerosol deposition method.

Figure 4B:
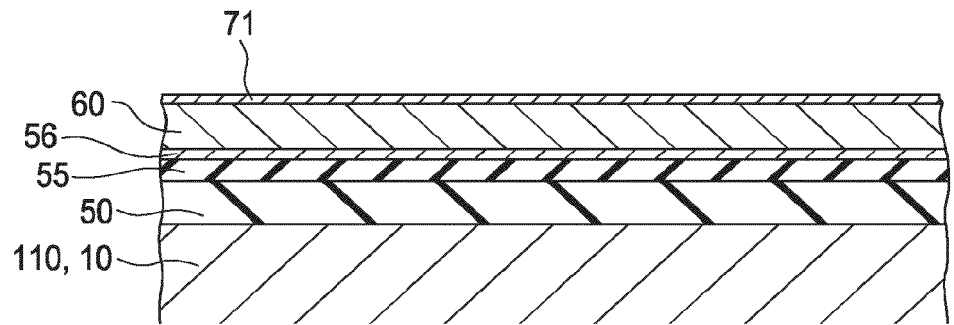
FIG. 4B is a cross-sectional view of the recording head in its production process according to Embodiment 1.

In a specific example of the procedure for forming the piezoelectric layer 70, first, as shown in FIG. 4B, on the first electrode 60, a sol or an MOD solution (precursor solution) containing organometallic compounds, specifically, organometallic compounds containing potassium (K), sodium (Na), bismuth (Bi), niobium (Nb), iron (Fe), and chromium (Cr) at a ratio so as to give a target composition ratio is applied by, for example, spin coating to form a piezoelectric film precursor 71 (application step).

The precursor solution to be applied is prepared by mixing organometallic compounds respectively containing K, Na, Bi, Nb, Fe, and Cr at a molar ratio to give a desired ratio of each metal and dissolving or dispersing the resulting mixture in an organic solvent, for example, alcohol such as 1-butanol. Examples of the organometallic compounds respectively containing K, Na, Bi, Nb, Fe, and Cr include metal alkoxides, organic acid salts, and β-diketone complexes. Examples of the organometallic compound containing K include potassium 2-ethylhexanoate, potassium acetate, potassium acetylacetate, and potassium ethoxide. Examples of the organometallic compound containing Na include sodium 2-ethylhexanoate, sodium acetate, sodium acetylacetate, and sodium ethoxide. Examples of the organometallic compound containing Bi include bismuth 2-ethylhexanoate and bismuth acetate. Examples of the organometallic compound containing Nb include niobium ethoxide, niobium 2-ethylhexanoate, and niobium pentaethoxide. Examples of the organometallic compound containing Fe include iron 2-ethylhexanoate. Examples of the organometallic compound containing Cr include chromium 2-ethylhexanoate. An organometallic compound containing two or more of K, Na, Bi, Nb, Fe, and Cr may be used. The organometallic compounds may be mixed at a desired molar ratio of each metal.

Then, the piezoelectric film precursor 71 is heated at a predetermined temperature (e.g., 100 to 200° C.) for a predetermined time for drying (drying step). Subsequently, the dried piezoelectric film precursor 71 is heated to a predetermined temperature (e.g., 350 to 450° C.) and is kept at the temperature for a predetermined time for degreasing (degreasing step). Herein, the term "degreasing" means that organic components contained in the piezoelectric film precursor 71 are eliminated as, for example, $NO_2$, $CO_2$, or $H_2O$. The atmospheres for the drying step and the degreasing step are not limited, and these steps may be performed in the air or in an inert gas.

Figure 4C:
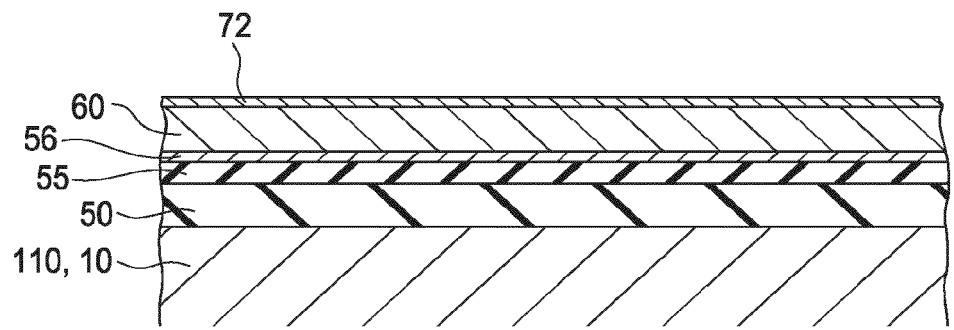
FIG. 4C is a cross-sectional view of the recording head in its production process according to Embodiment 1.

Then, as shown in FIG. 4C, the piezoelectric film precursor 71 is heated to a predetermined temperature, for example, about 600 to 800° C., and is kept at the temperature for a predetermined time for crystallization to form a piezoelectric film 72 (firing step). The atmosphere for the firing step is also not limited, and the step may be performed in the air or in an inert gas.

As the heating apparatus used in the drying step, the degreasing step, or the firing step, for example, a rapid thermal annealing (RTA) apparatus performing heating by irradiation with an infrared lamp or a hot plate can be used.

Figure 5A:
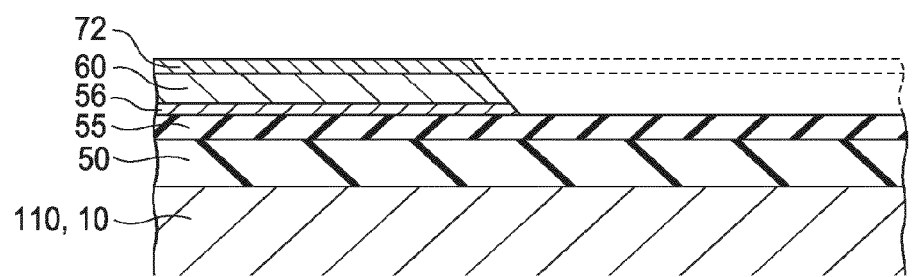
FIG. 5A is a cross-sectional view of the recording head in its production process according to Embodiment 1.

Then, as shown in FIG. 5A, for example, the adhesive layer 56, the first electrode 60, and the first layer of the piezoelectric film 72 are simultaneously patterned so as to have an incline at their side faces using a resist (not shown) having a predetermined shape as a mask on the piezoelectric film 72.

Figure 5B:
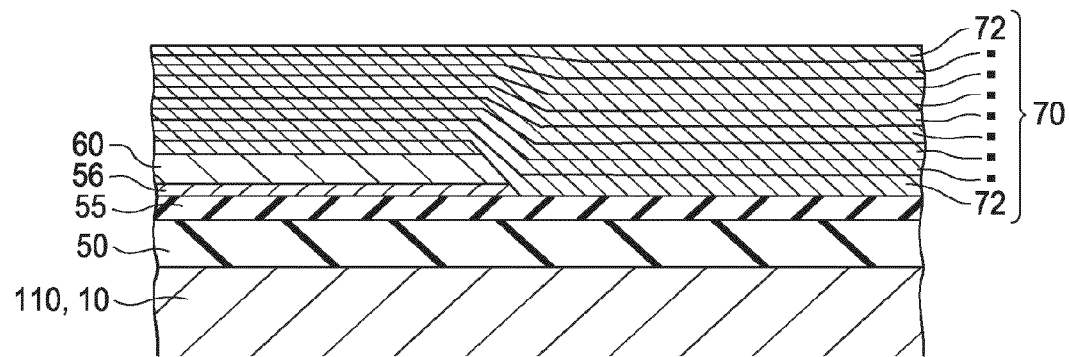
FIG. 5B is a cross-sectional view of the recording head in its production process according to Embodiment 1.

Then, after removal of the resist, as shown in FIG. 5B, a piezoelectric layer 70 composed of a plurality of the piezoelectric films 72 and having a predetermined thickness is formed by repeating more than once the application step, the drying step, and the degreasing step, or the application step, the drying step, the degreasing step, and the firing step, depending on the desired thickness and other factors. For example, when the thickness of each application of a solution is about 0.1 μm, the total thickness of the piezoelectric layer 70 composed of, for example, ten layers of the piezoelectric films 72 is about 1.0 μm. In this embodiment, the piezoelectric layer 70 is formed by laminating the piezoelectric films 72, but may be a single layer.

Figure 6A:
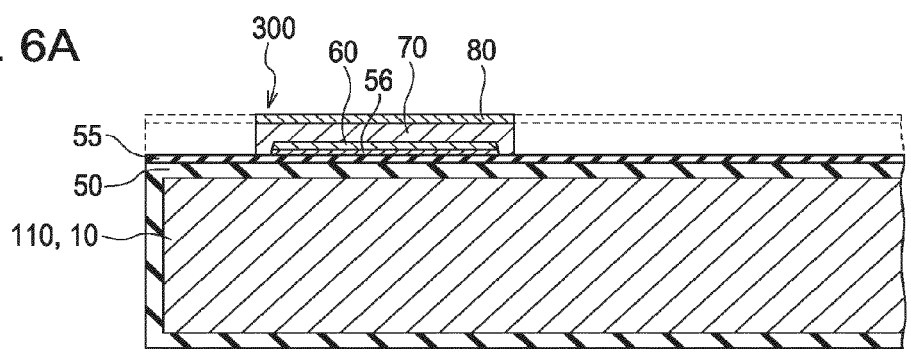
FIG. 6A is a cross-sectional view of the recording head in its production process according to Embodiment 1.

After the piezoelectric layer 70 is thus-formed, as shown in FIG. 6A, a second electrode 80 of, for example, platinum is formed on the piezoelectric layer 70 by, for example, sputtering. Subsequently, the piezoelectric layer 70 and the second electrode 80 are simultaneously patterned in areas corresponding to the pressure-generating chambers 12 to form piezoelectric elements 300 each composed of the first electrode 60, the piezoelectric layer 70, and the second electrode 80. The patterning of the piezoelectric layer 70 and the second electrode 80 can be performed at once by dry etching through a resist (not shown) having a predetermined shape. Then, as necessary, post annealing may be performed in a temperature range of 600 to 800° C. By doing so, a good interface can be formed between the piezoelectric layer 70 and the first electrode 60 or the second electrode 80, and also the crystallinity of the piezoelectric layer 70 can be improved.

Figure 6B:
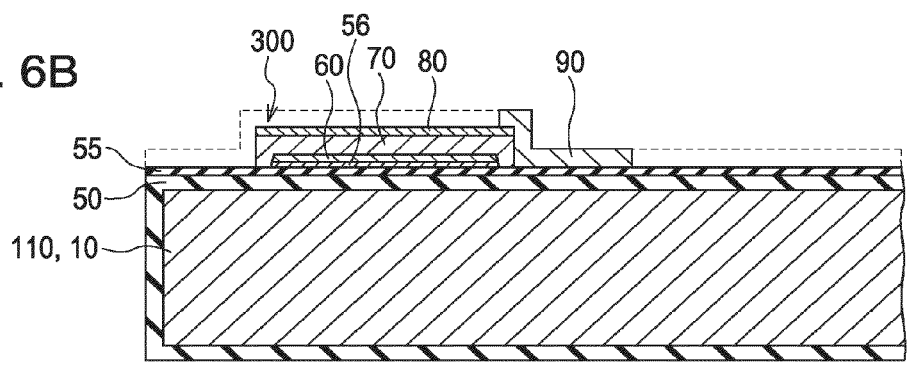
FIG. 6B is a cross-sectional view of the recording head in its production process according to Embodiment 1.

Then, as shown in FIG. 6B, a lead electrode 90 of, for example, gold (Au) is formed on the entire surface of the passage-forming substrate wafer 110 and then is patterned through a mask pattern (not shown) of a resist or the like for each piezoelectric element 300.

Figure 6C:
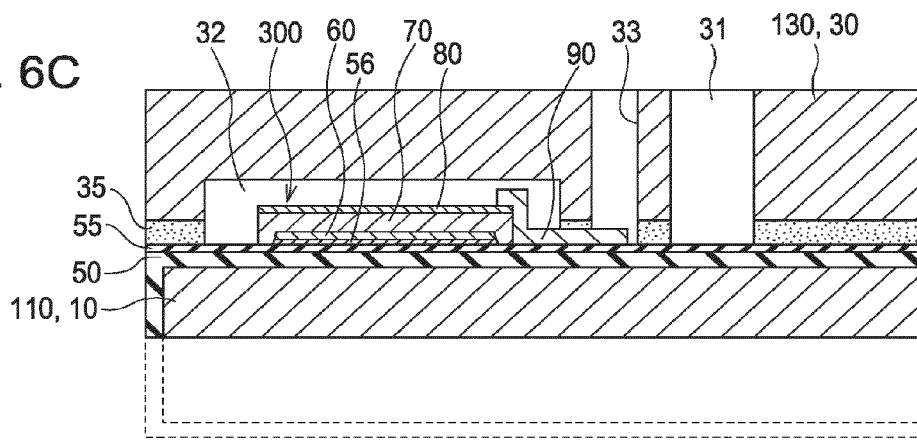
FIG. 6C is a cross-sectional view of the recording head in its production process according to Embodiment 1.

Then, as shown in FIG. 6C, a protective substrate wafer 130 that is a silicon wafer for forming a plurality of protective substrates 30 is bonded to the passage-forming substrate wafer 110 on the piezoelectric elements 300 side with an adhesive 35, and, subsequently, the passage-forming substrate wafer 110 is thinned to a predetermined thickness.

Figure 7A:
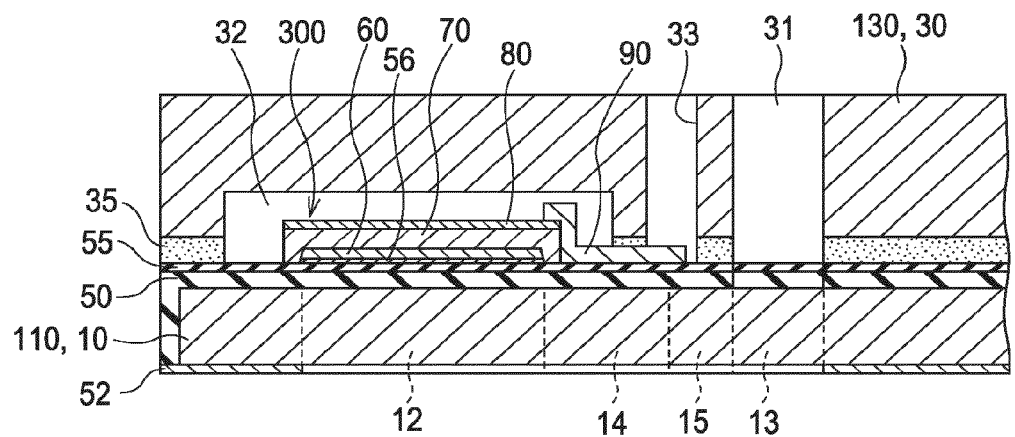
FIG. 7A is a cross-sectional view of the recording head in its production process according to Embodiment 1.

Subsequently, as shown in FIG. 7A, a new mask film 52 is formed on the passage-forming substrate wafer 110 and patterned into a predetermined shape.

Figure 7B:
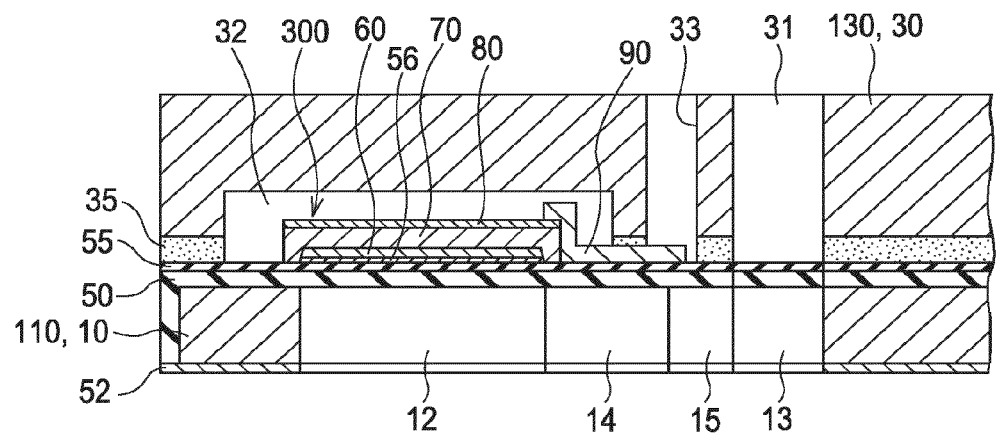
FIG. 7B is a cross-sectional view of the recording head in its production process according to Embodiment 1.

Then, as shown in FIG. 7B, the passage-forming substrate wafer 110 is anisotropically etched (wet-etched) using an alkaline solution, such as KOH, through the mask film 52 to form the pressure-generating chambers 12, the communicating portion 13, the ink-supplying paths 14, and the communicating paths 15 corresponding to the piezoelectric elements 300.

Then, unnecessary portions at the outer peripheral portions of the passage-forming substrate wafer 110 and the protective substrate wafer 130 are removed by cutting, e.g., by dicing. The mask film 52 on the passage-forming substrate wafer 110 on the opposite side from the protective substrate wafer 130 is removed. Subsequently, a nozzle plate 20 perforated with nozzle openings 21 is bonded to the passage-forming substrate wafer 110, and a compliance substrate 40 is bonded to the protective substrate wafer 130, and the passage-forming substrate wafer 110 and other associated components are divided into individual chip-sized passage-forming substrates 10 and other components as shown in FIG. 1 to give an ink jet recording head I of this embodiment.

The invention will be described in more detail with reference to examples below, but the invention is not limited to the following examples.

Example 1

Preparation of Piezoelectric Film Precursor Solution

Organometallic compounds containing K, Na, Bi, Nb, Fe, and Cr were mixed at a predetermined ratio to prepare a piezoelectric film precursor solution. Specifically, potassium ethoxide, sodium ethoxide, and niobium pentaethoxide were mixed to prepare a KNN solution having a molar ratio of K:Na:Nb of 0.5:0.5:1; bismuth 2-ethylhexanoate and iron 2-ethylhexanoate were mixed to prepare a BFO solution having a molar ratio of Bi:Fe of 1:1; and bismuth 2-ethylhexanoate and chromium 2-ethylhexanoate were mixed to prepare a BCO solution having a molar ratio of Bi:Cr of 1:1. The KNN solution, the BFO solution, and the BCO solution were mixed at a molar ratio of KNN:BFO:BCO of 100:3:3 to prepare a piezoelectric film precursor solution. Production of piezoelectric element First, a silicon dioxide film was formed on a surface of a silicon substrate by thermal oxidation. Then, a zirconium oxide film was formed on the silicon dioxide film by producing a zirconium film by sputtering and thermally oxidizing the zirconium film. Subsequently, titanium dioxide with 40 nm thickness was laminated on the zirconium oxide film, and (111)-oriented platinum with 150 nm was laminated on the titanium dioxide to form a first electrode.

Then, a piezoelectric layer was formed on the first electrode by spin coating. Specifically, the piezoelectric film-forming composition (precursor solution) was applied dropwise onto the substrate on which the titanium oxide film and the first electrode were formed, and the substrate was rotated at 500 rpm for 5 sec for application and then at 2500 rpm for 25 sec for application to form a piezoelectric film precursor (application step). Subsequently, the film precursor was dried at 150° C. for 2 min and then dried and degreased at 350° C. for 4 min (drying and degreasing step). The application step and the drying and degreasing step were repeated three times, and then firing was performed by rapid thermal annealing (RTA) at 700° C. for 5 min (firing step). A cycle consisting of performing the application step and the drying and degreasing step three times and then performing the firing step for collectively firing the films was repeated three times. As a result, application was performed nine times in total to form a piezoelectric layer 70 having a total thickness of 750 nm.

Then, a platinum film having a thickness of 100 nm was formed as a second electrode 80 on the piezoelectric layer 70 by DC sputtering, followed by firing at 650° C. for 5 min by RTA to form a piezoelectric element 300 including a piezoelectric layer 70 of a complex oxide having a perovskite structure containing potassium, sodium, and bismuth in the A site and niobium, iron, and chromium in the B site.

Example 2

A piezoelectric element 300 was formed in the same manner as in Example 1 except that the piezoelectric film precursor solution was prepared so as to have a molar ratio of KNN:BFO:BCO of 100:3:5.

Example 3

A piezoelectric element 300 was formed in the same manner as in Example 1 except that the piezoelectric film precursor solution was prepared so as to have a molar ratio of KNN:BFO:BCO of 100:3:8.

Example 4

A piezoelectric element 300 was formed in the same manner as in Example 1 except that the piezoelectric film precursor solution was prepared so as to have a molar ratio of KNN:BFO:BCO of 100:3:12.

Comparative Example 1

A piezoelectric element 300 was formed in the same manner as in Example 1 except that the piezoelectric film-forming composition did not contain BCO.

Test Example 1

Figure 8:
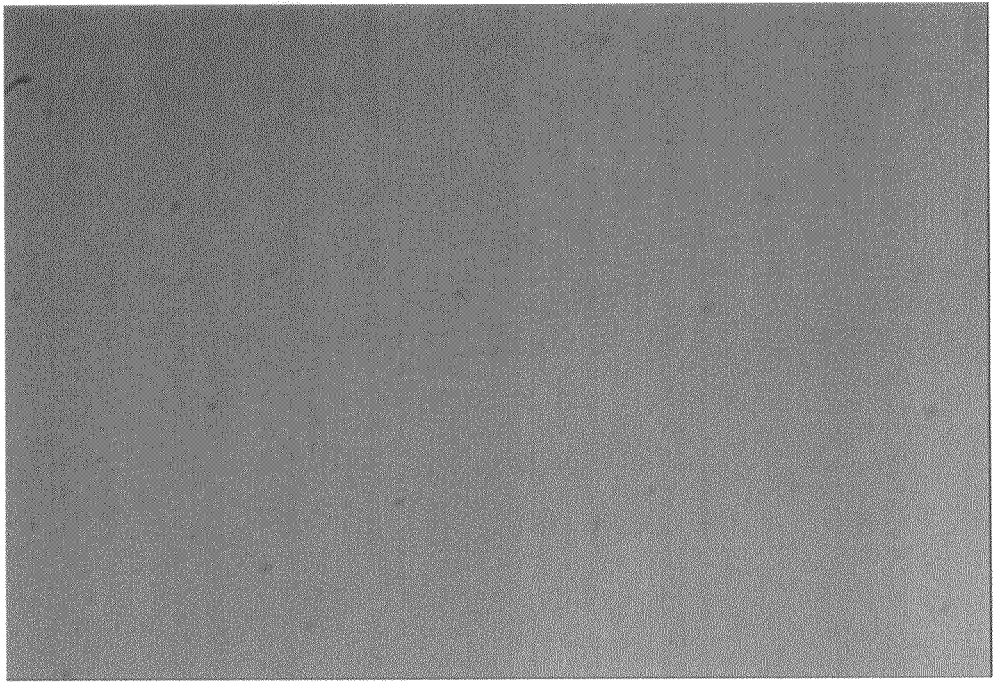
FIG. 8 is a photograph of the surface of a piezoelectric layer in Example 2 observed by a metal microscope.
Figure 9:
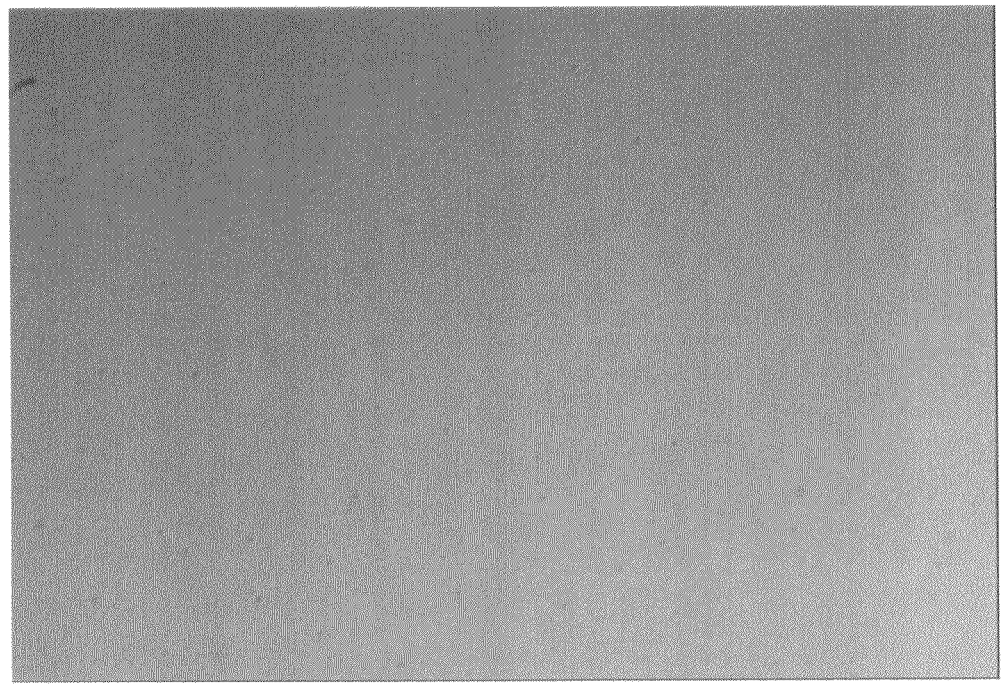
FIG. 9 is a photograph of the surface of a piezoelectric layer in Example 3 observed by a metal microscope.
Figure 10:
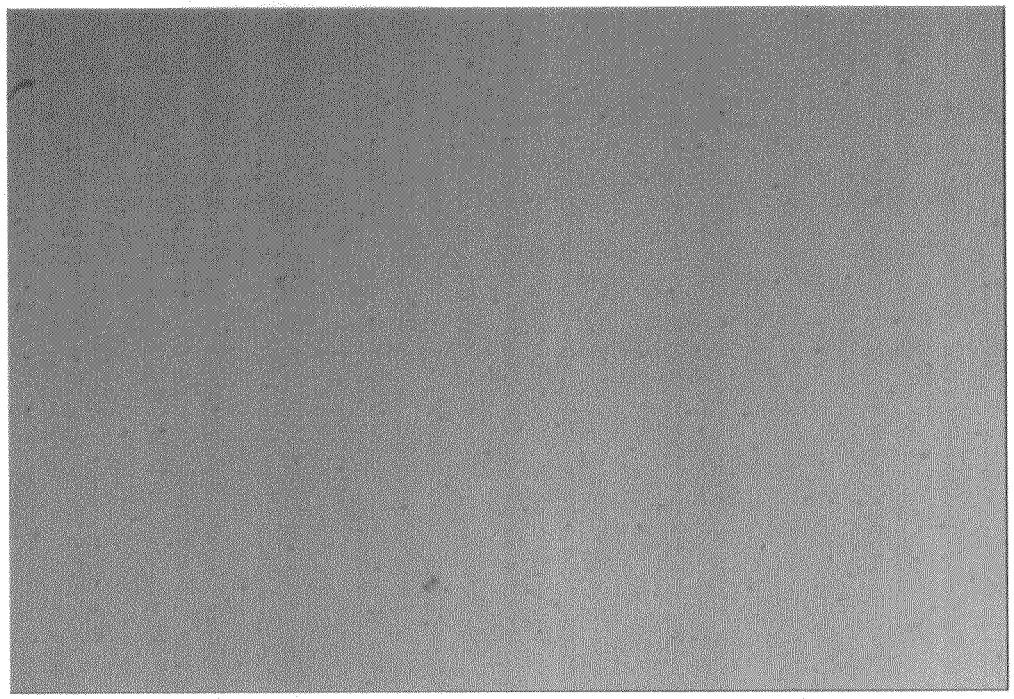
FIG. 10 is a photograph of the surface of a piezoelectric layer in Example 4 observed by a metal microscope.
Figure 11:
FIG. 11 is a photograph of the surface of a piezoelectric layer in Comparative Example 1 observed by a metal microscope.
Figure 12:
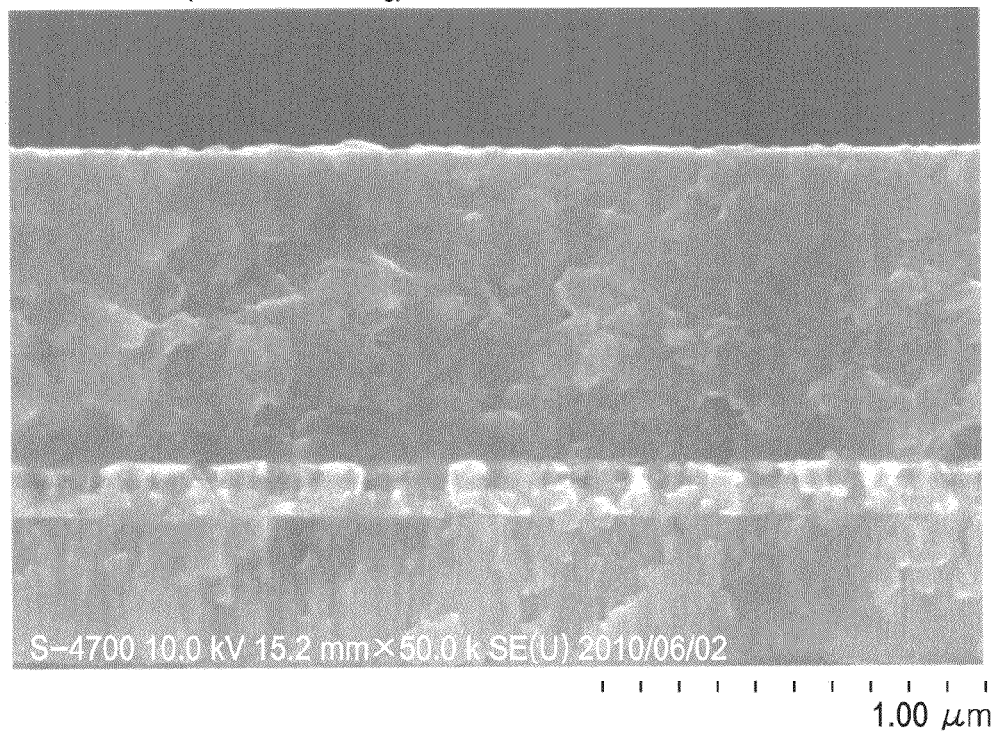
FIG. 12 is a photograph of a cross-section of the piezoelectric layer in Example 1 observed by SEM.
Figure 13:
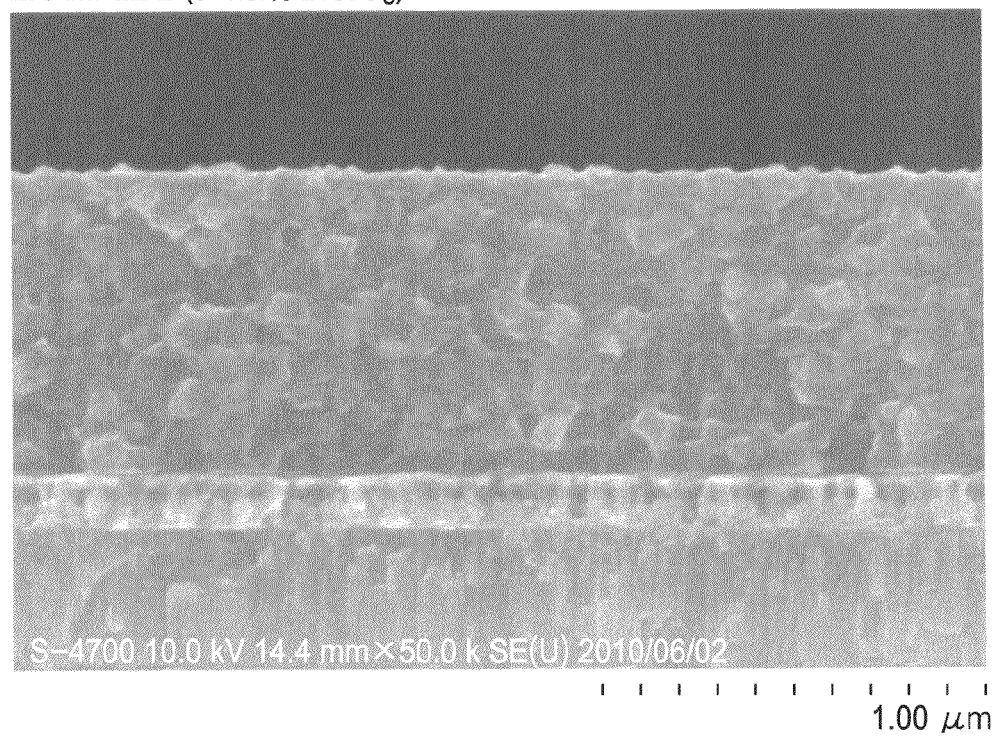
FIG. 13 is a photograph of a cross-section of the piezoelectric layer in Example 2 observed by SEM.
Figure 14:
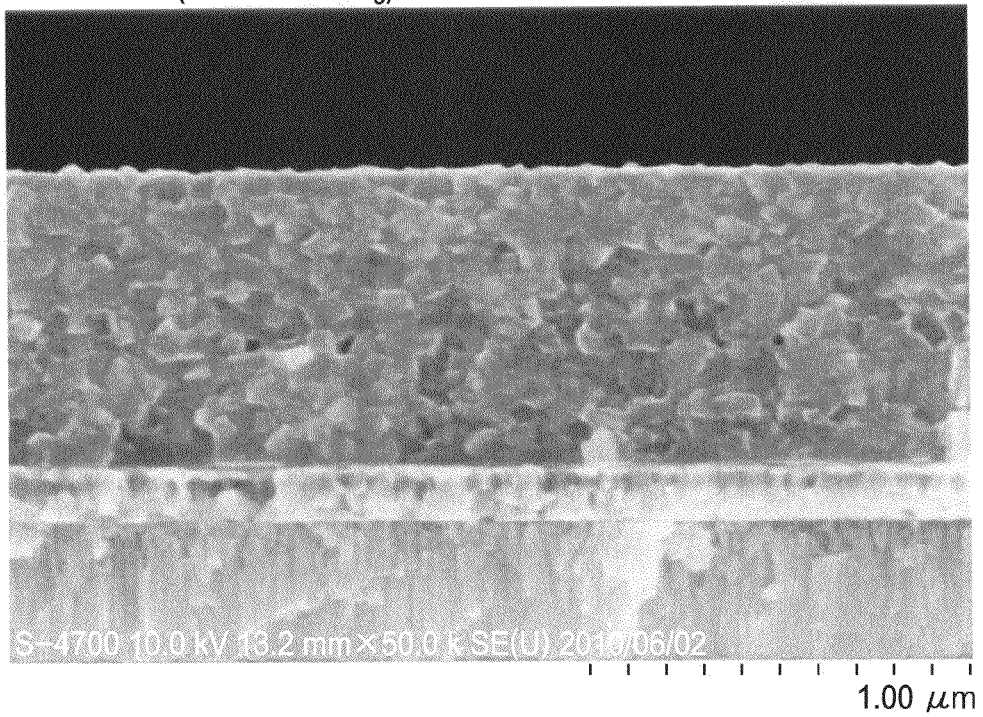
FIG. 14 is a photograph of a cross-section of the piezoelectric layer in Example 3 observed by SEM.
Figure 15:
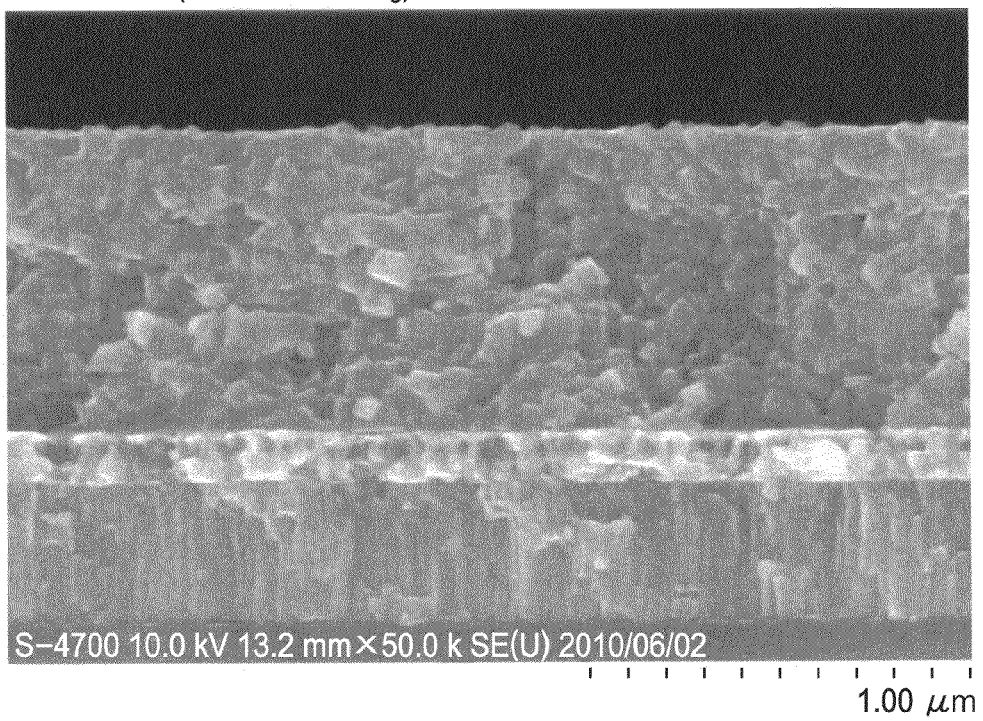
FIG. 15 is a photograph of a cross-section of the piezoelectric layer in Example 4 observed by SEM.

In each of Examples 1 to 4 and Comparative Example 1, the surface of the piezoelectric layer was observed with a metal microscope of 500-fold magnification before the formation of the second electrode. In Examples 1 to 4, no cracking was observed. In contrast, in Comparative Example 1, cracking was observed. FIGS. 8, 9, and 10 show the results of Examples 2, 3, and 4, respectively, and FIG. 11 shows the result of Comparative Example 1.

Test Example 2

Figure 16:
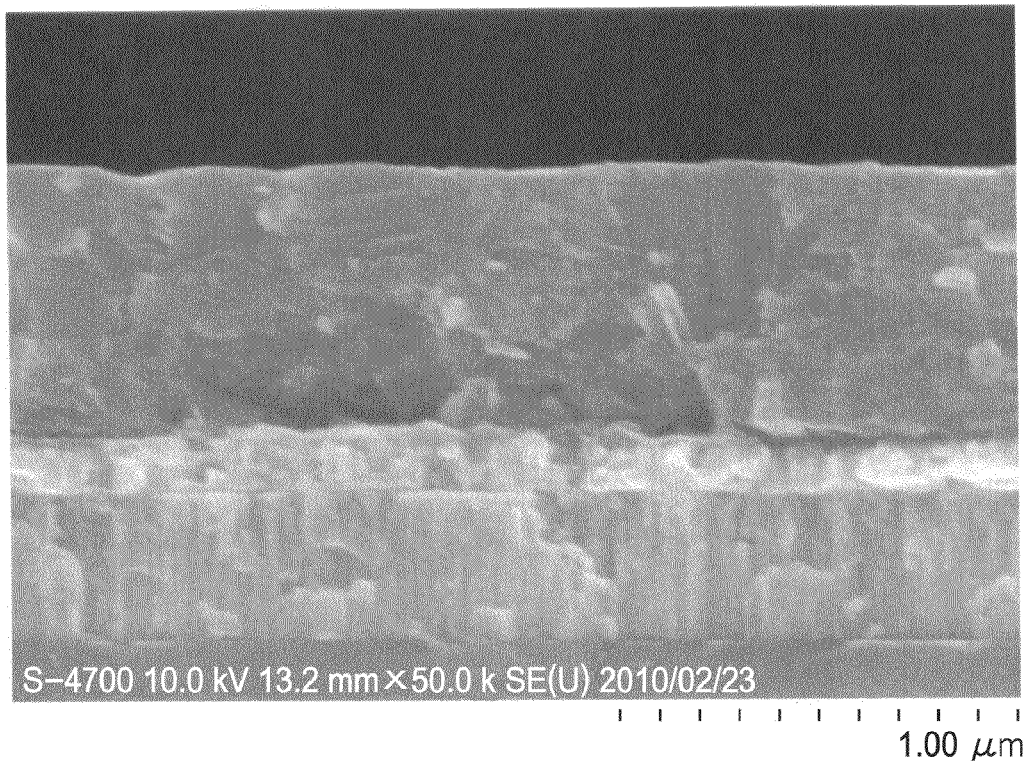
FIG. 16 is a photograph of a cross-section of the piezoelectric layer in Comparative Example 1 observed by SEM.

In each of Examples 1 to 4 and Comparative Example 1, a cross-section was observed with a scanning electron microscope (SEM) of 5000-fold magnification before the formation of the second electrode. The formation of a piezoelectric layer was confirmed in each of Examples 1 to 4 and Comparative Example 1. FIGS. 12, 13, 14, and 15 show the results of Examples 1, 2, 3, and 4, respectively, and FIG. 16 shows the result of Comparative Example 1.

Test Example 3

Figure 17:
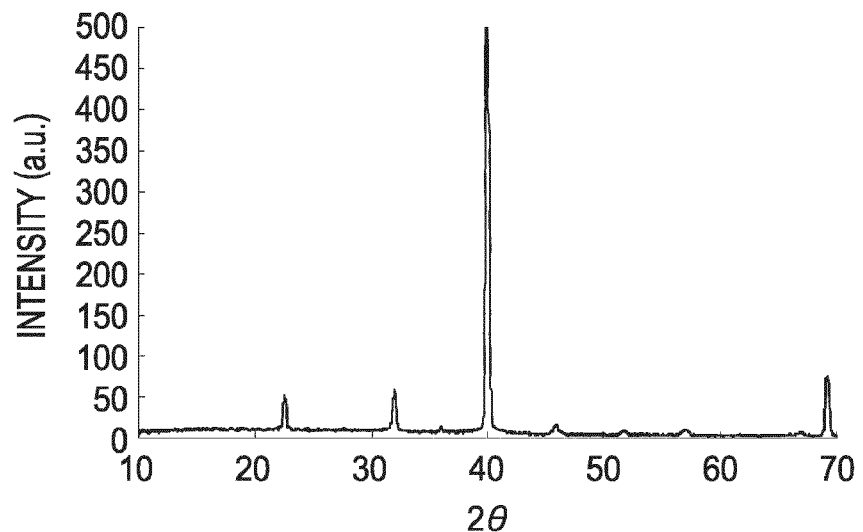
FIG. 17 is a graph showing the XRD measurement results in Example 1.
Figure 18:
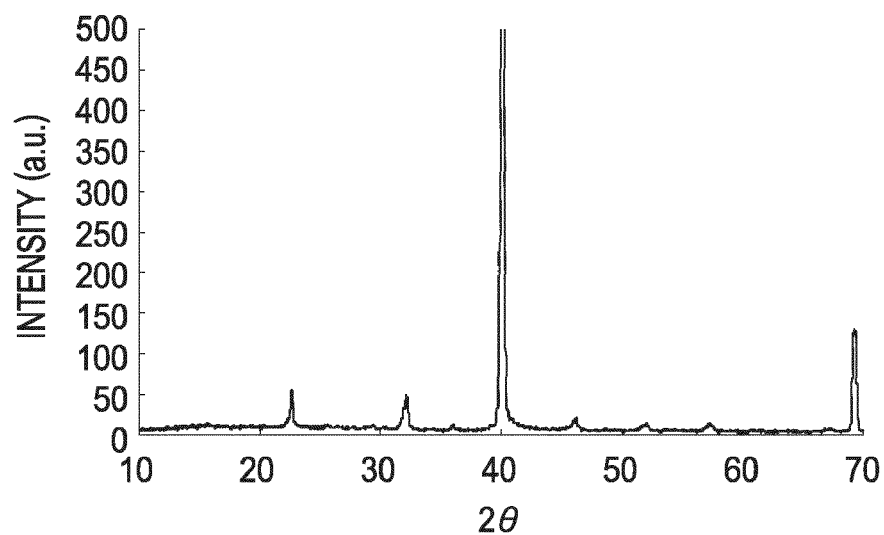
FIG. 18 is a graph showing the XRD measurement results in Comparative Example 1.

Regarding each of the piezoelectric elements of Examples 1 to 4 and Comparative Example 1, the thin-film X-ray diffraction pattern of the piezoelectric layer was obtained with "D8 Discover" manufactured by Bruker AXS using CuK α-rays as an X-ray source at room temperature. In all of the piezoelectric elements of Examples 1 to 4 and Comparative Example 1, perovskite structures ($ABO_3$-type structure) were formed, and no peaks caused by other heterogeneous phases were observed. The behaviors of the thin-film X-ray diffraction patterns were almost the same in Examples 1 to 4 and Comparative Example 1, which revealed that the addition of BCO to the piezoelectric film-forming composition does not affect the thin-film X-ray diffraction pattern of the piezoelectric layer. As an example of the results, FIGS. 17 and 18 show the X-ray diffraction patterns of Example 1 and Comparative Example 1, respectively, where a correlation between diffraction intensity and diffraction angle $2\theta$ is shown.

Other Embodiment

An embodiment according to an aspect of the invention has been described above, but the basic constitution of the invention is not limited thereto. For example, in the above-described embodiment, a single-crystal silicon substrate 10 is used as the passage-forming substrate 10, but the passage-forming substrate 10 is not limited thereto and may be, for example, a SOI substrate or a glass substrate.

In addition, in the above-described embodiment, as an example, the piezoelectric elements 300 are formed by sequentially laminating a first electrode 60, a piezoelectric layer 70, and a second electrode 80 on a substrate (passage-forming substrate 10), but is not particularly limited thereto. The invention can be applied to, for example, a longitudinal vibration-type piezoelectric element that extends and contracts in the axial direction by alternately laminating a piezoelectric material and an electrode-forming material.

Figure 19:
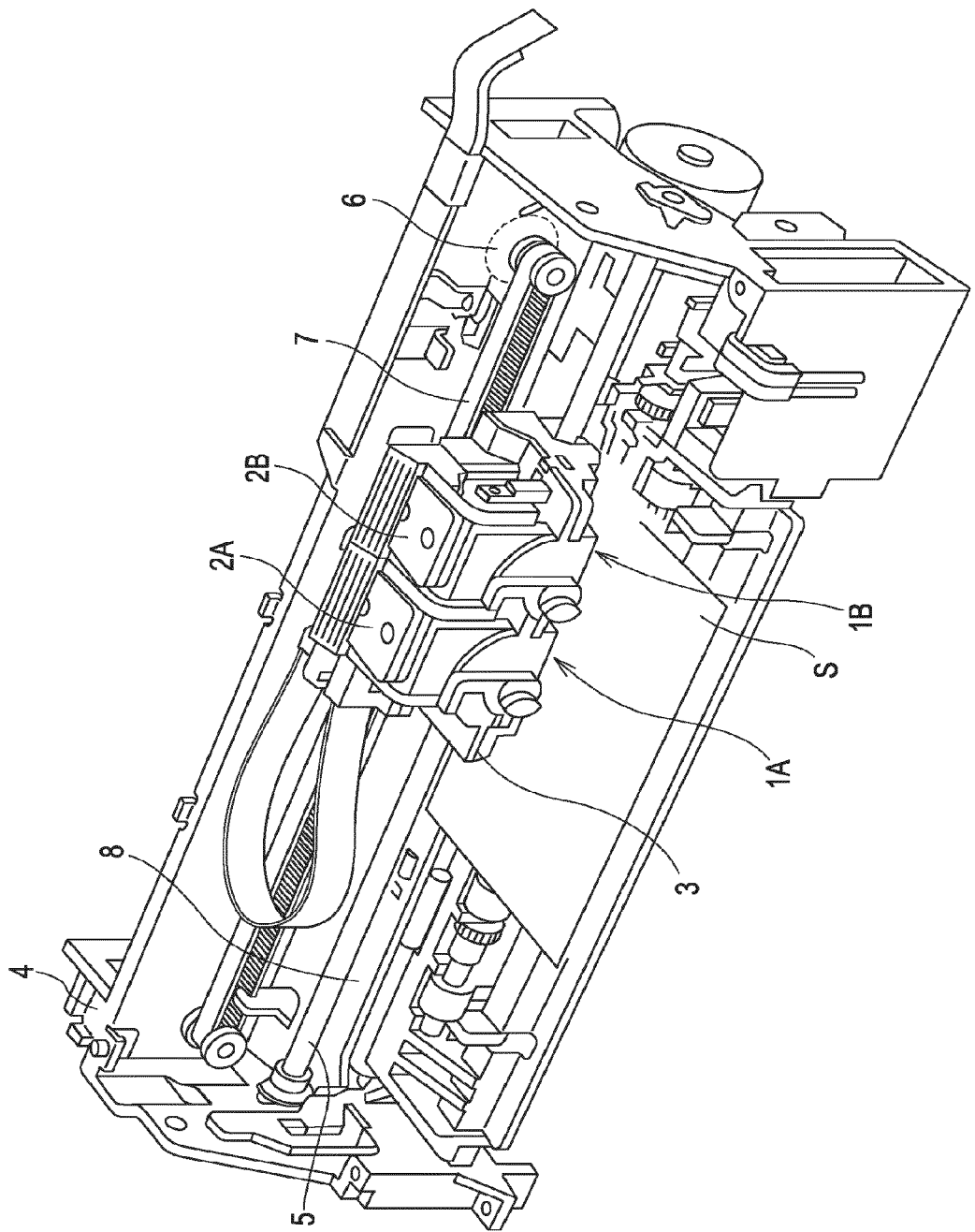
FIG. 19 is a view schematically showing the constitution of a recoding apparatus according to an embodiment of an aspect of the invention.

The ink jet recording head of the embodiment constitutes a part of a recording head unit including an ink flow path that communicates with, for example, an ink cartridge and is mounted on an ink jet recording apparatus. FIG. 19 is a schematic view showing an example of the ink jet recording apparatus.

As shown in FIG. 19, the recording head units 1A and 1B including the ink jet recording heads I are detachably provided with cartridges 2A and 2B constituting ink supplying means. A carriage 3 on which the recording head units 1A and 1B are mounted is set to a carriage axis 5, which is fixed to an apparatus body 4, in a manner that the carriage 3 is movable in the axial direction. The recording head units 1A and 1B discharge, for example, a black ink composition and a color ink composition, respectively.

Driving force of a driving motor 6 is transferred to the carriage 3 through a plurality of gears (not shown) and a timing belt 7, and thereby the carriage 3, on which the recording head units 1A and 1B are mounted, is moved along the carriage axis 5. The apparatus body 4 is provided with a platen 8 along the carriage axis 5, and a recording sheet S, serving as a recording medium such as paper, is fed by, for example, a feeding roller (not shown) and is wrapped around the platen 8 and thereby transported.

In the example shown in FIG. 19, the ink jet recording head units 1A and 1B each have one ink jet recording head I, but are not particularly limited thereto. For example, one ink jet recording head unit 1A or 1B may have two or more ink jet recording heads.

In the above-described embodiment, an ink jet recording head has been described as an example of the liquid ejecting head, but the invention broadly covers general liquid ejecting heads and can be applied to liquid ejecting heads that eject liquid other than ink. Examples of the other liquid ejecting heads include various types of recording heads used in image recording apparatuses such as printers, coloring material ejecting heads used for producing color filters of, for example, liquid crystal displays, electrode material ejecting heads used for forming electrodes of, for example, organic electroluminescent (EL) displays or field emission displays (FEDs), and bio-organic material ejecting heads used for producing bio-chips.

The piezoelectric element of the invention is, as described above, suitable as piezoelectric elements of liquid ejecting heads represented by ink jet recording heads, but the application is not limited thereto. For example, the piezoelectric element can be applied to piezoelectric elements of ultrasonic devices such as ultrasonic transmitters, ultrasonic motors, piezoelectric transformers, and various types of sensors such as infrared sensors, ultrasonic sensors, thermal sensors, pressure sensors, and pyroelectric sensors.

What is claimed is:

1. A piezoelectric element comprising:
    a piezoelectric layer; and
    an electrode provided to the piezoelectric layer,
    wherein the piezoelectric layer is configured of a complex oxide having a perovskite structure containing potassium, sodium, and bismuth, niobium, iron, and chromium, wherein the perovskite structure is expressed by the formula $ABO_3$ and potassium, sodium, and bismuth are in the A site and niobium, iron, and chromium are in the B site.

2. The piezoelectric element according to claim 1, wherein the complex oxide has a mixed crystal including potassium sodium niobate, bismuth ferrate, and bismuth chromate.

3. The piezoelectric element according to claim 1, wherein the complex oxide has a molar ratio of chromium to niobium (chromium/niobium) of 0.03 or more.

4. The piezoelectric element according to claim 1, wherein the complex oxide has a molar ratio of chromium to niobium (chromium/niobium) of 0.05 or more and 0.08 or less.

5. The piezoelectric element according to claim 1, wherein the piezoelectric layer has a thickness of 1 μm or more.

6. A liquid ejecting head comprising the piezoelectric element according to claim 1.

7. A liquid ejecting apparatus comprising the liquid ejecting head according to claim 6.

\* \* \* \* \*